(12) United States Patent
Chen et al.

(10) Patent No.: US 12,253,246 B2
(45) Date of Patent: Mar. 18, 2025

(54) LENS, VEHICLE LAMP AND CORRESPONDING VEHICLE

(71) Applicant: VALEO VISION, Bobigny (FR)

(72) Inventors: Wenqing Chen, Wuhan (CN); Changqi Wu, Wuhan (CN); Weifang Huang, Wuhan (CN); Xiaoling Zhang, Wuhan (CN)

(73) Assignee: Valeo Vision, Bobigny (FR)

( * ) Notice: Subject to any disclaimer, the term of this patent is extended or adjusted under 35 U.S.C. 154(b) by 0 days.

(21) Appl. No.: 18/663,623

(22) Filed: May 14, 2024

(65) Prior Publication Data

US 2024/0295312 A1 Sep. 5, 2024

Related U.S. Application Data

(63) Continuation of application No. 17/639,516, filed as application No. PCT/CN2020/112768 on Sep. 1, 2020, now abandoned.

(30) Foreign Application Priority Data

Sep. 3, 2019 (CN) .......................... 201910826734.8

(51) Int. Cl.
*F21V 23/04* (2006.01)
*B60Q 3/76* (2017.01)
(Continued)

(52) U.S. Cl.
CPC ............. *F21V 23/0485* (2013.01); *B60Q 3/76* (2017.02); *F21V 5/046* (2013.01); *B60Q 3/82* (2017.02);
(Continued)

(58) Field of Classification Search
CPC ............... H03K 17/955; H03K 17/962; H03K 2017/9507; H03K 2217/96038;
(Continued)

(56) References Cited

U.S. PATENT DOCUMENTS 10,476,501 B2  11/2019  Salter et al.
11,091,090 B2  8/2021  Norais et al.
(Continued)

FOREIGN PATENT DOCUMENTS

CN  103474849 A  12/2013
CN  204099975 U  1/2015
(Continued)

OTHER PUBLICATIONS

China National Intellectual Property Administration (ISA/CN), International Search Report (with English translation) and Written Opinion of corresponding International Application No. PCT/CN2020/112768, dated Nov. 30, 2020.
(Continued)

*Primary Examiner* — Colin J Cattanach
(74) *Attorney, Agent, or Firm* — Valeo Vision

(57) ABSTRACT

A lens, a vehicle lamp, and a corresponding vehicle, the lens including a lens portion with a touch area and an antenna portion including a flange portion, the antenna portion being electrically conductive and at least partially opposite to the touch area. When the touch area of the lens provided with the antenna portion is touched, the capacitance of a capacitor formed by the antenna portion will change.

20 Claims, 5 Drawing Sheets

(51) Int. Cl.
*B60Q 3/82* (2017.01)
*F21V 5/04* (2006.01)
*F21W 106/00* (2018.01)
*H03K 17/95* (2006.01)
*H03K 17/955* (2006.01)
*H03K 17/96* (2006.01)

(52) U.S. Cl.
CPC .......... *F21V 23/04* (2013.01); *F21V 23/0442* (2013.01); *F21V 23/0471* (2013.01); *F21V 23/0478* (2013.01); *F21W 2106/00* (2018.01); *H03K 2017/9507* (2013.01); *H03K 17/955* (2013.01); *H03K 17/962* (2013.01); *H03K 2217/96038* (2013.01); *H03K 2217/96042* (2013.01); *H03K 2217/960785* (2013.01)

(58) Field of Classification Search
CPC ........ H03K 2217/96042; H03K 2217/960785; B60Q 3/82; F21V 23/04; F21V 23/0442; F21V 23/0471; F21V 23/0478; F21V 23/0485
See application file for complete search history.

(56) References Cited

U.S. PATENT DOCUMENTS

| | | |
|---|---|---|
| 2008/0089079 A1 | 4/2008 | Gunnewig et al. |
| 2008/0198613 A1 | 8/2008 | Cruickshank |
| 2013/0063317 A1 | 3/2013 | Jonsson et al. |
| 2013/0113397 A1 | 5/2013 | Salter et al. |
| 2014/0002405 A1 | 1/2014 | Salter et al. |
| 2018/0297513 A1 | 10/2018 | Salter et al. |
| 2018/0304805 A1 | 10/2018 | Villacres Mesias et al. |
| 2018/0345856 A1 | 12/2018 | Willmann et al. |
| 2019/0113674 A1 | 4/2019 | Gipson |
| 2020/0089079 A1 | 3/2020 | Ando et al. |

FOREIGN PATENT DOCUMENTS

| | | |
|---|---|---|
| CN | 105674224 A | 6/2016 |
| CN | 208124022 U | 11/2018 |
| CN | 108973844 A | 12/2018 |
| DE | 102008025057 A1 | 12/2009 |
| DE | 102014217200 A1 | 3/2016 |
| EP | 3357755 A1 | 8/2018 |
| FR | 3072447 A1 | 4/2019 |
| JP | 2011046211 A | 3/2011 |
| JP | 2012040970 A | 3/2012 |
| JP | 2012224263 A | 11/2012 |
| WO | 2013172526 A1 | 11/2013 |
| WO | 2017214657 A1 | 12/2017 |
| WO | 2018038291 A1 | 3/2018 |

OTHER PUBLICATIONS

Japanese Patent Office, Office Action (with English translation) of corresponding Japanese Patent Application No. 2022-514621, dated Feb. 24, 2023.

LENS, VEHICLE LAMP AND CORRESPONDING VEHICLE

TECHNICAL FIELD

The present application relates to the technical field of optics, in particular to a lens, a vehicle lamp and a corresponding vehicle.

BACKGROUND OF THE INVENTION

Most existing vehicle interior lamps require mechanical switches for control and operation. However, to meet the demand for diversity of design as well as to save space, it is often necessary to dispense with mechanical switches.

SUMMARY OF THE INVENTION

In view of the above, one problem solved by an embodiment of the present application is to enable touch-controlled operation of a vehicle lamp.

According to one aspect of the present application, a lens is provided, characterized in that the lens comprises:
  a lens part for transmitting a light beam, the lens part comprising a touch region; and
  an antenna part, the antenna part being electrically conductive and being at least partially opposite the touch region.

According to an embodiment of the present application, a change will occur in a capacitance value of a capacitor formed by the antenna part when the touch region is touched.

In some embodiments, the antenna part comprises an annular structure, and a central through-hole of the annular structure is configured to transmit the light beam toward the lens part.

In some embodiments, the antenna part further comprises a flange part, the flange part being formed around the central through-hole, and extending from a surface of the annular structure toward a side remote from the lens part.

According to an embodiment of the present application, the flange part can increase the touch sensitivity of the part of the touch region opposite the central through-hole, such that the touch sensitivity is more consistent across the entire touch region.

In some embodiments, the flange part is a continuous wall-like structure or intermittent wall-like structure surrounding the central through-hole.

In some embodiments, the annular structure has an arc-shaped surface.

According to an embodiment of the present application, the distance between the annular structure having the arc-shaped surface and the lens part can be kept consistent, so that the sensitivity of the touch region opposite the annular structure is kept consistent In some embodiments, the antenna part and the lens part are integrally formed by an overmolding process.

According to an embodiment of the present application, the use of overmolding enables the formation of a one-piece member for touch/sensing, thus eliminating a mounting structure and mounting step of mounting the antenna part to the lens part, while also avoiding an air gap between the antenna part and the lens part, thereby increasing the touch sensitivity and reliability.

In some embodiments, the antenna part further comprises multiple openings arranged on the annular structure.

In some embodiments, the multiple openings comprise a small hole and/or a groove.

Another aspect of the present application further provides a vehicle lamp, comprising any lens as described above, and further comprising a sensing part, a control part and a light source, wherein:
  the sensing part is configured to provide an electrical connection between the antenna part and the control part;
  the control part is configured to perceive a change in a capacitance value of a capacitor formed by the antenna part, and control the on/off of the light source according to the change.

According to an embodiment of the present application, the lens part of the vehicle lamp can be utilized to achieve switching control, thus saving space, so that the vehicle lamp is more compact and adaptable to a greater variety of designs.

In some embodiments, the change occurs in the capacitance value of the capacitor formed by the antenna part when the touch region is touched.

In some embodiments, the sensing part may be either of the following structures:
  an elastic reed;
  a coil spring.

In some embodiments, the vehicle lamp is an in-vehicle reading lamp.

Another aspect of the present application further provides a vehicle, comprising any vehicle lamp as described above.

BRIEF DESCRIPTION OF DRAWINGS

Other features, objects and advantages of the present application will become more obvious through perusal of a detailed description of non-limiting embodiments which makes reference to the accompanying drawings below.

Figure 1:
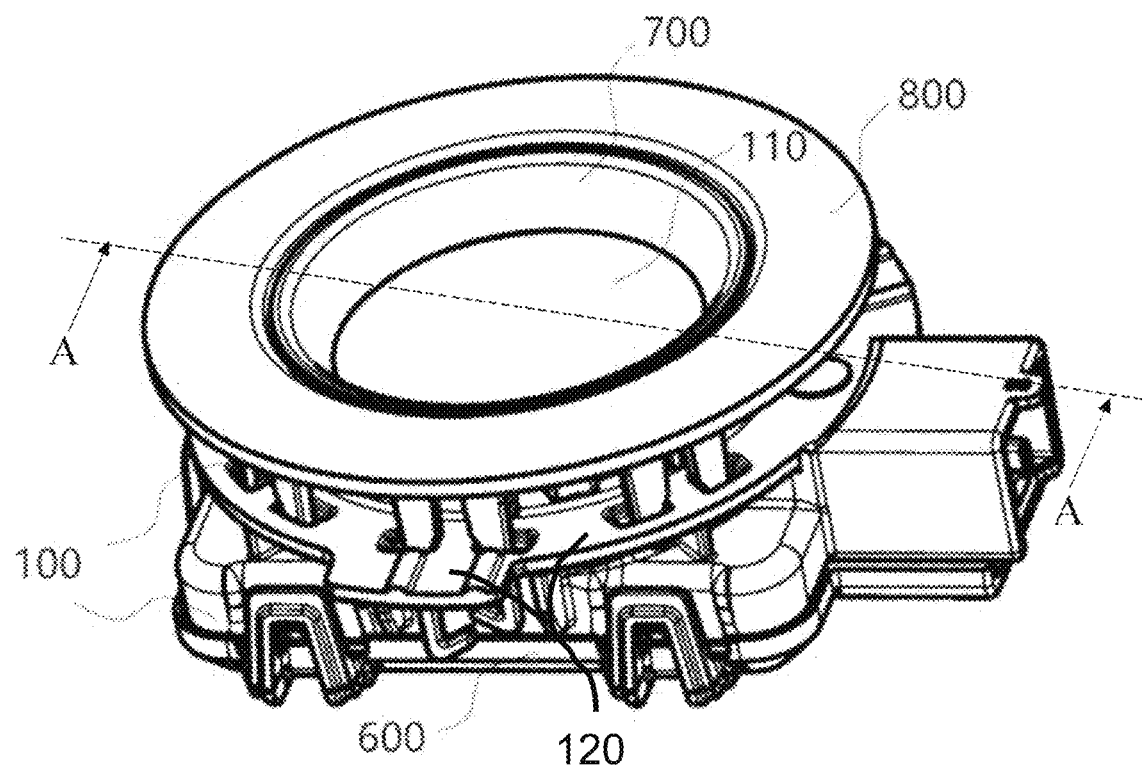
FIG. 1 is a schematic 3D view of a vehicle lamp according to an embodiment of the present application.

List of component labels:

| P1  | lens                | 100 | lens part            |
|-----|---------------------|-----|----------------------|
| 200 | antenna part        | 300 | sensing part         |
| 400 | inner lens          | 500 | PCBA                 |
| 600 | housing             | 700 | chrome-plated member |
| 800 | light-blocking plate| 110 | touch region         |
| 210 | flange part         | 220 | opening              |
| 230 | annular structure   | 240 | central through-hole |
| 510 | light source        | 120 | supporting part      |

DETAILED DESCRIPTION OF THE INVENTION

Preferred embodiments of the present application will be described in more detail below with reference to the accompanying drawings. Although preferred embodiments of the present application are shown in the drawings, it should be understood that the present application may be realized in various forms, and should not be restricted by the embodiments expounded here. Rather, these embodiments are provided so that this application will be more thorough and complete, and will fully convey the scope of this application to those skilled in the art.

According to embodiments of the present application, the following are disclosed: a lens, a vehicle lamp corresponding to the lens, and a vehicle.

A vehicle lamp according to this embodiment: referring to FIGS. 1-5, the vehicle lamp according to the present application comprises a lens P1, a sensing part 300, a control part (not shown) and a light source 510.

The lens P1 comprises a lens part 100 and an antenna part 200. The lens part 100 is configured to transmit a light beam, and comprises a touch region 110; the antenna part 200 is electrically conductive, and is at least partially opposite the touch region 110. If a user touches the touch region 110, this will cause a capacitance value of a capacitor formed by the antenna part 200 to change. The sensing part 300 is configured to provide an electrical connection between the antenna part 200 and the control part; the control part is configured to perceive a change in the capacitance value of the capacitor formed by the antenna part 200, and control the on/off switching of the light source 520 according to this change.

Figure 2:
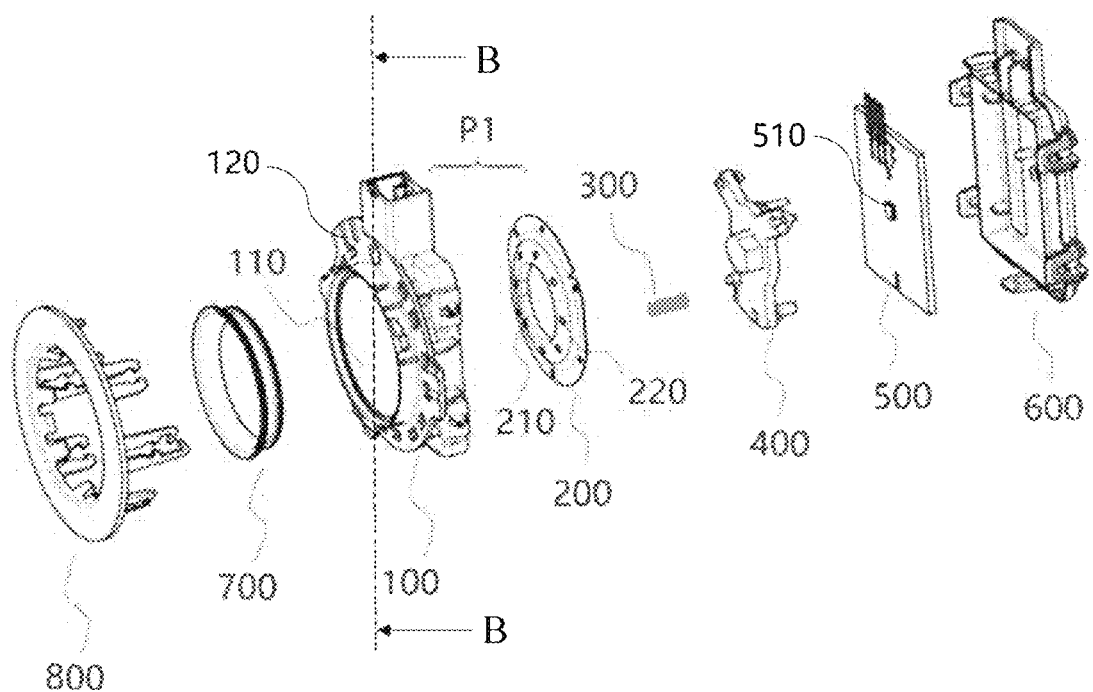
FIG. 2 is an exploded schematic diagram of a vehicle lamp according to an embodiment of the present application.
Figure 3:
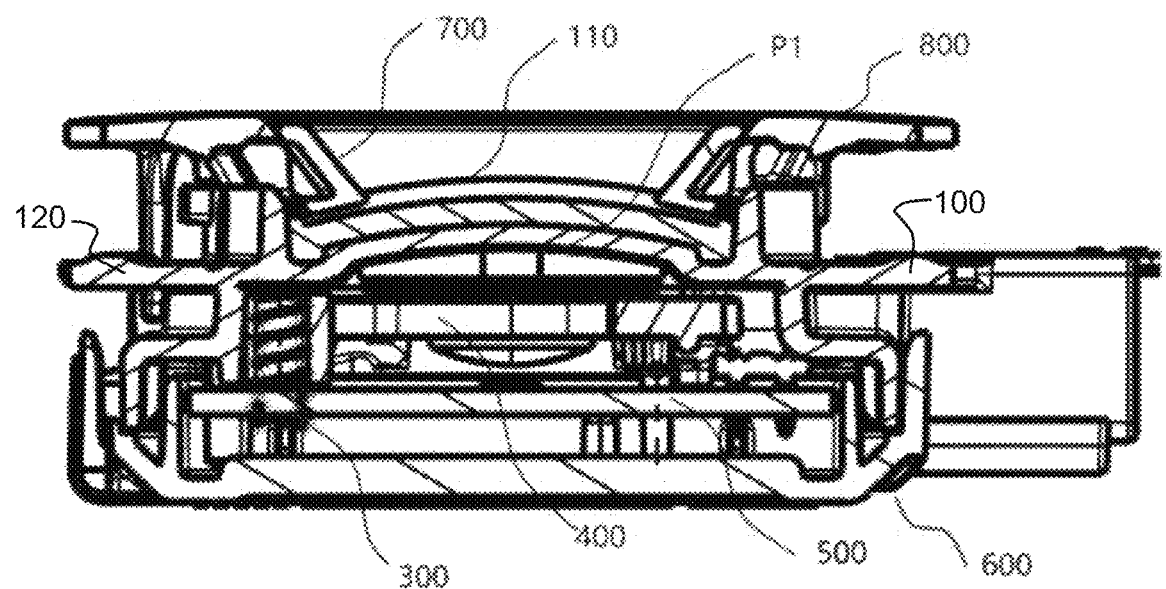
FIG. 3 is a schematic drawing of a cross section of the vehicle lamp in FIG. 1, taken along the axis A-A.

In one embodiment, the lens part 100 may be made of a light-permeable material, for example but not limited to a transparent glass, resin or plastic material, such as transparent PC (polycarbonate), PMMA (polymethyl methacrylate), etc. In addition, as shown in FIG. 2, the lens part 100 may also comprise a supporting part 120 that is integral with the touch region 110.

In one embodiment, the antenna part 200 may be a metal member, or may be a non-metal member, but covered with an electrically conductive layer, for example but not limited to an electroplated layer, an electrically conductive ink layer, etc.

Figure 4:
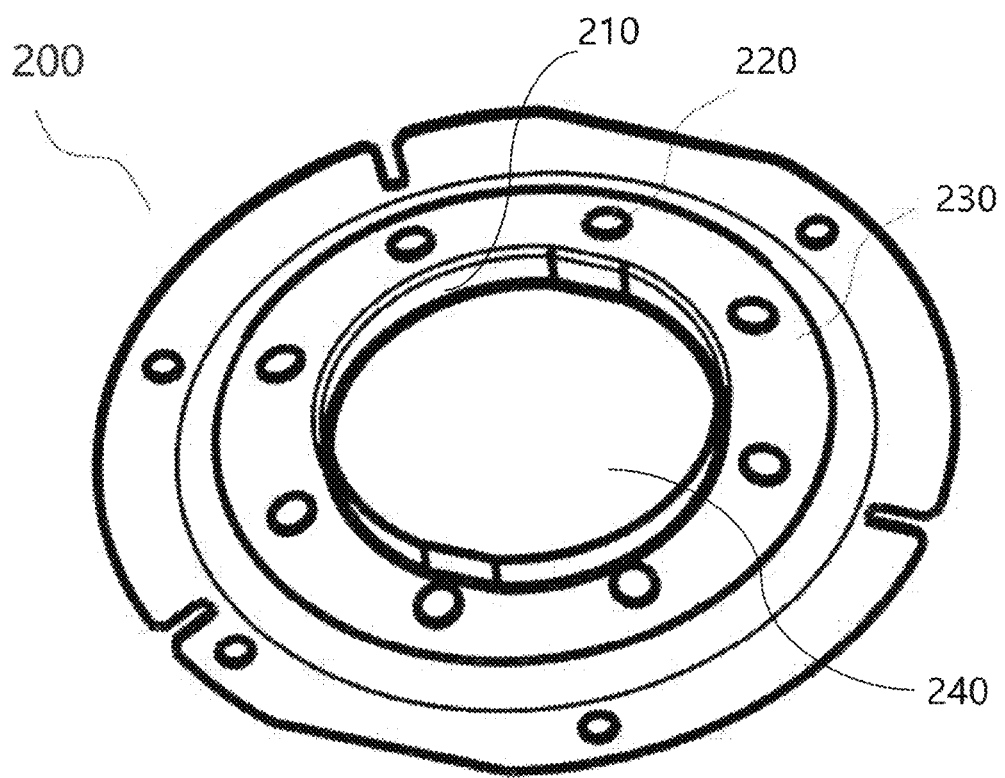
FIG. 4 is a schematic structural diagram of an antenna part 200 according to an embodiment of the present application.

In one embodiment, as shown in FIG. 4, the antenna part 200 may comprise an annular structure 230, with a central through-hole 240 of the annular structure 230 being configured to transmit a light beam toward the lens part 100. Preferably, the annular structure 230 may be a plate-like structure.

Figure 5:
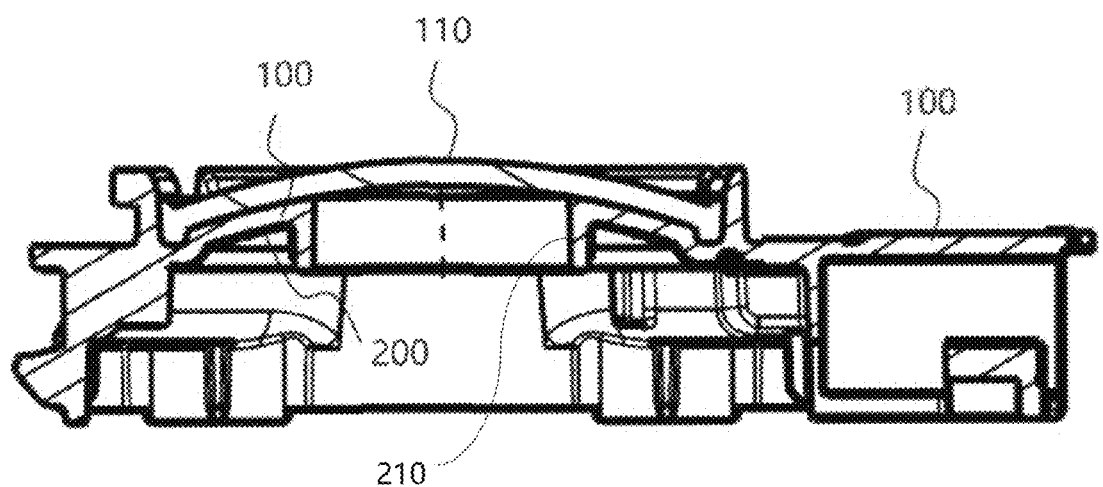
FIG. 5 is a schematic drawing of a cross section of the lens P1 lamp in FIG. 2, taken along the axis B-B.

In addition, as shown in FIG. 5, the annular structure 230 may have an arc-shaped surface adapted to the lens part 100; in this way, the distance between the annular structure 230 and the lens part 100 can be kept consistent, so that the sensitivity of the touch region 110 opposite the annular structure 230 is kept consistent.

In one embodiment, the antenna part 200 may further comprise a flange part 210; the flange part 210 is formed around the central through-hole 240 of the annular structure 230, and extends from the surface of the annular structure 230 toward the side remote from the lens part 100. For example, as shown in FIGS. 4 and 5, the flange part 210 is a continuous wall-like structure surrounding the central through-hole 240, but as will be understood, the flange part 210 may also be an intermittent wall-like structure surrounding the central through-hole 240. Due to the presence of the central through-hole 240, the touch sensitivity of the part of the touch region 110 opposite the central through-hole will be relatively low. However, the flange part 210 can increase the area of the antenna part 200 opposite a central part of the touch region 110, thereby increasing the touch sensitivity of this part, such that the touch sensitivity is more consistent across the entire touch region 110.

In addition, the flange part 210 and annular structure 230 may be a one-piece member.

In one embodiment, the lens part 100 and antenna part 200 may be a one-piece member, for example but not limited to being formed by an overmolding process. In this case, as shown in FIG. 4, the antenna part 200 further comprises multiple openings 220 arranged on the annular structure 230, for fixing the lens part 100 to the antenna part 200 during injection molding. As shown in FIG. 4, the multiple openings 220 may take the form of small holes, but may also take the form of grooves, or both small holes and grooves. Preferably, the multiple openings are uniformly distributed on the flange part 210.

The use of overmolding enables the formation of a one-piece member for touch/sensing, thus eliminating a mounting structure and mounting step of mounting the antenna part to the lens part, while also avoiding an air gap between the antenna part and the lens part, thereby increasing the touch sensitivity and reliability.

In one embodiment, the sensing part 300 may be any elastic structure capable of transmitting current signals, for example but not limited to an elastic reed, a coil spring, etc.

In one embodiment, the vehicle lamp further comprises a PCBA (printed circuit board assembly) 500, with the control part and light source 510 both being arranged on the PCBA 500.

In addition, the control part may control the on/off switching of the light source 510 according to predetermined control logic, for example but not limited to the following: when the user touches the touch region 110 a first time, the control part perceives a change in the capacitance value of the capacitor formed by the antenna part 200, and thereby switches on the light source 510, and when the user touches the touch region 110 a second time, the control part switches off the light source 510; or for example, the control part switches on a first setting of the light source 510 when the user touches the touch region 110 a first time, the control part switches on a second setting of the light source 510 when the user touches the touch region 110 a second time, the control part switches on a third setting of the light source 510 when the user touches the touch region 110 a third time, and the control part 510 switches off the light source 510 when the user touches the touch region 110 a fourth time.

In one embodiment, as shown in FIG. 1, the vehicle lamp may further comprise a light-blocking plate 800, a chrome-plated member 700 and a housing 600. Depending on the optical requirements corresponding to the vehicle lamp, the vehicle lamp may also comprise an inner lens 400, and the sensing part 300 may pass through the inner lens 400 and be connected to the PCB 500.

It must be explained that the lens P1 is not limited to application to the vehicle lamp described above, and may also be applied to any other suitable illuminating or signal-indicating device.

The present application has the following advantages: it provides a lens having an antenna part, wherein the capacitance value of the capacitor formed by the antenna part will change when the touch region is touched; and it also provides a touch-controlled vehicle lamp realized using the lens, which is more compact structurally and adaptable to a greater variety of design demands, with more consistent touch sensitivity in the touch region.

It will be apparent to those skilled in the art that the present application is not limited to the details of the above-described exemplary embodiments, and may be implemented in other specific forms without departing from the spirit or essential characteristics of the present application. Thus, regardless of which viewpoint is taken, the embodiments should be regarded as being demonstrative and non-limiting; the scope of the present application is defined by the attached claims and not by the explanation above, hence it is intended that all changes falling within the meaning and scope of equivalent key elements of the claims be included in the present application. No reference signs in the claims should be regarded as limiting the claims concerned. In addition, it is obvious that the word "comprises" does not exclude other units or steps, and the singular does not exclude the plural. Multiple units or apparatuses presented in system claims may also be realized by one unit or apparatus by means of software or hardware. Words such as first and second are used to indicate designations, and do not indicate any specific order.

The invention claimed is:

1. A lens assembly, comprising:
a lens part for transmitting a light beam, the lens part including a touch region;
an antenna part, wherein the antenna part includes an annular structure and a central through-hole in the annular structure;
the lens part disposed over an inner lens;
the antenna part being electrically conductive and located at least partially opposite the touch region; and
the antenna part configured to mate with an elastic reed that passes through the inner lens.

2. The lens assembly of claim 1, where the central through-hole is configured to transmit the light beam toward the lens part.

3. The lens assembly of claim 2, wherein the antenna part includes a flange part, with the flange part being formed around the central through-hole and extending from a surface of the annular structure toward a side remote from the lens part.

4. The lens assembly of claim 3, wherein the flange part is a continuous wall-like structure or intermittent wall-like structure surrounding the central through-hole.

5. The lens assembly of claim 2, where the annular structure has an arc-shaped surface.

6. The lens assembly of claim 1, wherein the antenna part and the lens part are integrally formed by an overmolding process.

7. The lens assembly of claim 2, wherein the antenna part includes multiple openings arranged on the annular structure.

8. The lens assembly of claim 7, wherein each of the multiple openings includes a small hole or a groove.

9. The lens assembly of claim 1, where a light-blocking plate is configured to retain a chrome plate at an interface of the lens part, the interface located at a support part that is integral with the touch region.

10. A vehicle lamp, comprising:
a lens part for transmitting a light beam, the lens part including a touch region;
an antenna part being electrically conductive and located at least partially opposite the touch region;
the lens part disposed over an inner lens;
a sensing part, a control part and a light source, where the sensing part includes a coil spring and the sensing part is configured to pass through the inner lens;
wherein the sensing part is configured to provide an electrical connection between the antenna part and the control part; and
the control part configured to perceive a change in a capacitance value of a capacitor formed by the antenna part and control the on/off of the light source according to the change.

11. The vehicle lamp of claim 10, wherein the change occurs in the capacitance value of the capacitor formed by the antenna part when the touch region is touched.

12. The vehicle lamp of claim 10, where a flange part is formed around a central through-hole of an antenna part and extends from a surface of the antenna part toward a side remote from the lens part the flange part being a continuous wall-like structure surrounding the central through-hole.

13. The vehicle lamp of claim 10, wherein the vehicle lamp is an in-vehicle reading lamp.

14. The vehicle lamp of claim 10, wherein a light-blocking plate is configured to retain a chrome plate at a support part of the lens part, the support part being integral with the touch region.

15. A lens assembly, comprising:
a lens part for transmitting a light beam, the lens part including a touch region; and
an antenna part, wherein the antenna part includes an annular structure and a central through-hole in the annular structure;
the lens part disposed over an inner lens;
the antenna part being electrically conductive and located at least partially opposite the touch region; and
the antenna part configured to mate with a coil spring that passes through the inner lens.

16. The lens assembly of claim 15, where the annular structure has an arc-shaped surface.

17. The lens assembly of claim 15, wherein the antenna part and the lens part are integrally formed by an overmolding process.

18. The lens assembly of claim 15, wherein the antenna pert includes multiple openings arranged on the annular structure.

19. The lens assembly of claim 18, wherein each of the multiple openings includes a small bole or a groove.

20. The lens assembly of claim 15, where a light-blocking plate is configured to retain a chrome plate at a support part of the lens part, the support part being integral with the touch region.

* * * * *

UNITED STATES PATENT AND TRADEMARK OFFICE
CERTIFICATE OF CORRECTION

| | | |
|---|---|---|
| PATENT NO. | : 12,253,246 B2 | Page 1 of 1 |
| APPLICATION NO. | : 18/663623 | |
| DATED | : March 18, 2025 | |
| INVENTOR(S) | : Wenqing Chen et al. | |

It is certified that error appears in the above-identified patent and that said Letters Patent is hereby corrected as shown below:

In the Claims

In Column 6 of Claim 10, Line 12, replace:
"… part and control the on/off of the light…"
With:
-- … part and control an on/off of the light… --

Signed and Sealed this
Twenty-eighth Day of October, 2025

John A. Squires
*Director of the United States Patent and Trademark Office*